US008731256B2

(12) United States Patent
Mori et al.

(10) Patent No.: US 8,731,256 B2
(45) Date of Patent: May 20, 2014

(54) AUTOMATED IMAGE ANALYSIS FOR MAGNETIC RESONANCE IMAGING

(75) Inventors: Susumu Mori, Ellicott City, MD (US);
Michael I. Miller, Jackson, NH (US);
Jiangyang Zhang, Baltimore, MD (US);
Kenichi Oishi, Baltimore, MD (US)

(73) Assignee: The Johns Hopkins University, Baltimore, MD (US)

( * ) Notice: Subject to any disclaimer, the term of this patent is extended or adjusted under 35 U.S.C. 154(b) by 732 days.

(21) Appl. No.: 12/747,816

(22) PCT Filed: Feb. 2, 2009

(86) PCT No.: PCT/US2009/032866
§ 371 (c)(1),
(2), (4) Date: Jun. 11, 2010

(87) PCT Pub. No.: WO2009/097612
PCT Pub. Date: Aug. 6, 2009

(65) Prior Publication Data
US 2010/0284595 A1 Nov. 11, 2010

Related U.S. Application Data

(60) Provisional application No. 61/063,025, filed on Jan. 31, 2008.

(51) Int. Cl.
*G06K 9/00* (2006.01)
*G06T 7/00* (2006.01)
(52) U.S. Cl.
CPC .................... *G06T 7/0012* (2013.01)
USPC ........................................................ 382/128
(58) Field of Classification Search
CPC .. G06K 9/6206; G06T 7/0012; G06T 7/0083; G06F 12/321

USPC .................................................. 382/128, 294
See application file for complete search history.

(56) References Cited

U.S. PATENT DOCUMENTS 6,373,250 B1 * 4/2002 Tsoref et al. ................. 324/309
6,633,686 B1 * 10/2003 Bakircioglu et al. ......... 382/294
(Continued)

FOREIGN PATENT DOCUMENTS

WO PCT/US/2009/000011    1/2009

OTHER PUBLICATIONS

Cao et al., "Large Deformation Diffeomorphic Metric Mapping of Vector Fields," Center for Imaging Science, Johns Hopkins University, May 31, 2005, pp. 1-2.*

(Continued)

*Primary Examiner* — Michelle L Le
(74) *Attorney, Agent, or Firm* — Venable LLP; Henry J. Daley

(57) ABSTRACT

A magnetic resonance imaging (MRI) system, comprising: a magnetic resonance imaging scanner configured to generate a plurality of signals for forming at least one magnetic resonance image of a soft tissue region from a subject under observation, wherein the at least one magnetic resonance image provides at least one integrating feature to facilitate automatic segmentation; a signal processing system in communication with the magnetic resonance imaging scanner to receive the plurality of signals; and a data storage unit in communication with the signal processing system, wherein the data storage unit contains at least one template corresponding to the soft tissue region, wherein the signal processing system is adapted to process the plurality of signals received from the magnetic resonance imaging scanner to automatically perform segmentation for the soft tissue region of the subject under observation by utilizing the at least one template and the at least one integrating feature.

31 Claims, 10 Drawing Sheets

(56) References Cited

U.S. PATENT DOCUMENTS

| | | | |
|---|---|---|---|
| 2004/0017892 A1* | 1/2004 | Sabol et al. | 378/98.11 |
| 2005/0215882 A1 | 9/2005 | Chenevert et al. | |
| 2006/0025673 A1* | 2/2006 | De Leon et al. | 600/410 |
| 2007/0263915 A1* | 11/2007 | Mashiach | 382/130 |

OTHER PUBLICATIONS

Pruessmann, K.P. et al., "SENSE: Sensitivity Encoding for Fast MRI," Magnetic Resonance Med., vol. 42, 1999, pp. 952-962.

Woods, R.P. et al., "Automated Image Registration: I. General Methods and Intrasubject, Intramodality Validation," J. Comput. Assist. Tomogr., vol. 22, No. 1, Jan./Feb. 1998, pp. 139-152.

Pierpaoli, C. et al., "Toward a Quantitative Assessment of Diffusion Anisotropy," Magnetic Resonance Med., vol. 36, 1996, pp. 893-906.

Jones, D.K. et al., "Optimal Strategies for Measuring Diffusion in Anisotropic Systems by Magnetic Resonance Imaging," Magnetic Resonance Med., vol. 42, Issue 3, Aug. 1999, pp. 515-525.

Huang, H. et al., "Analysis of Noise Effects on DTI-Based Tractography Using the Brute-Force and Multi-ROI Approach," Magnetic Resonance Imaging, vol. 52, 2004, pp. 559-565.

Miller, M. et al., "Statistical Methods in Computational Anatomy," Stat. Methods Med. Res., vol. 6, 1997, pp. 267-299.

Jiang, H. et al., "DtiStudio: Resource program for diffusion tensor computation and fiber bundle tracking," Comput. Methods Programs Biomed, vol. 81, 2006, pp. 106-116.

Alexander, D.C. et al., "Spatial Transformations of Diffusion Tensor Magnetic Resonance Imaging," IEEE Trans Med. Imaging, vol. 20, No. 11, Nov. 2001, pp. 1131-1139.

Xu, D. et al., "Spatial Normalization of Diffusion Tensor Fields," Magnetic Resonance Med., vol. 50, 2003, pp. 175-182.

Mori, S. et al., "Stereotaxic white matter atlas based on diffusion tensor imaging in an ICBM template," NeuroImage, vol. 40, 2008, pp. 570-582.

Miller, M.I. et al., "Mathematical textbook of deformable neuroanatomies," Proc. Natl. Acad. Sci., vol. 90, Dec. 1993, pp. 11944-11948.

Joshi, S.C. et al., "Hierarchical brain mapping via a generalized Direchlet solution for mapping brain manifolds," Geometric Methods in Applied Imaging, 1995, San Diego, California.

Granander and Miller, Statistical Computing & Statistical Graphics Newsletter, vol. 7, No. 3, Dec. 1996, pp. 3-8.

Beg, M.F. et al., "Computing Large Deformation Metric Mappings Via Geodesic Flows of Diffeomorphisms," International Journal of Computer Vision, vol. 61, No. 2, 2005, pp. 139-157.

Cao et al., "Large Deformation Diffeomorphic Metric Mapping of Vector Fields," Center for Imaging Science, Johns Hopkins University, May 31, 2005 pp. 1-2.

International Search Report for Application No. PCT/US2009/032866, Mar. 20, 2009.

\* cited by examiner

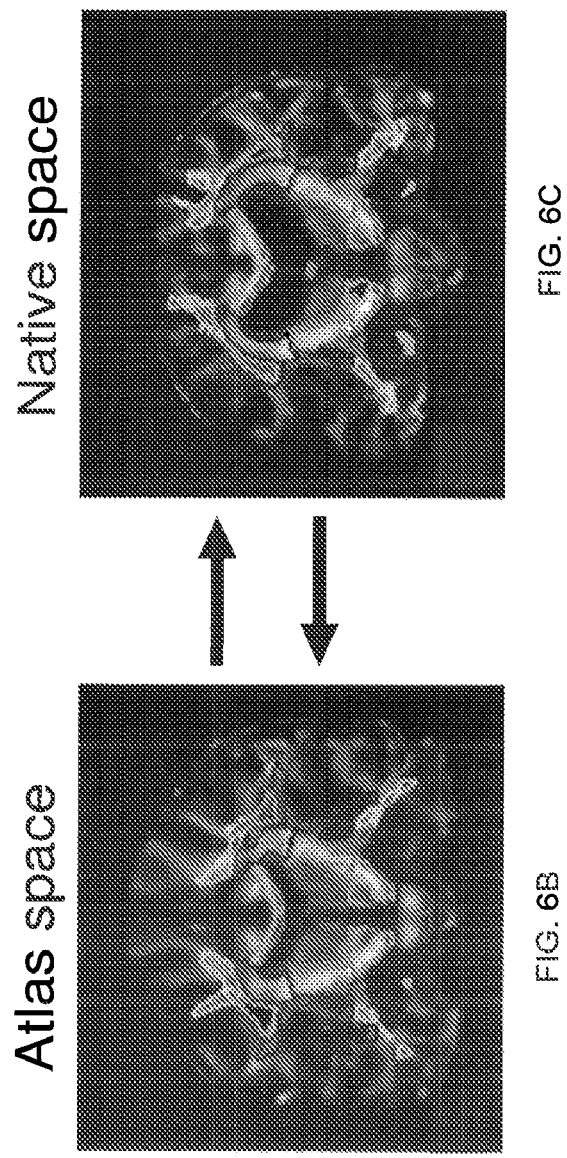

AUTOMATED IMAGE ANALYSIS FOR MAGNETIC RESONANCE IMAGING

CROSS-REFERENCE OF RELATED APPLICATION

This application claims priority to U.S. Provisional Application No. 61/063,025 filed Jan. 31, 2008, the entire contents of which are hereby incorporated by reference.

BACKGROUND

1. Field of Invention

The current invention relates to automated identification of soft tissue substructures in a soft tissue region of a human or animal subject in a non-invasive manner.

2. Discussion of Related Art

Although advancements in imaging hardware and software have substantially improved imaging throughput and image quality, there remains a bottleneck in radiological diagnosis. Currently, radiological diagnosis is mostly based on subjective visual inspection and judgment. However, manual reading is laborious and time-consuming. Furthermore, quite often, the amount of abnormality is not large compared to the normal range of subject variability. Quantitative analysis may significantly benefit current radiological diagnosis by improving our ability to detect and characterize abnormalities in a robust and reproducible manner. The current lack of quantitative analysis in clinical routines stems from, at least partly, difficulties in analyzing tissues based on magnetic resonance (MR) images. In neurological diagnosis, for example, high quality segmentation of the brain boundary requires a considerable amount of manual labor, which typically takes 2-4 hours for segmenting individual brains. Further segmentation of the brain into tissue classes takes even more time by manual labor. This may hinder delivery of quality service to our aging society with rising incidences of, for example, Alzheimer's disease. Existing automated programs for segmentation only provide approximate segmentation results that are inadequate for wide adoption in clinical routines. Thus, there is a need for an improved automatic segmentation of soft tissue structures of a person or an animal.

SUMMARY

Some embodiments of the current invention provide a magnetic resonance imaging (MRI) system, comprising: a magnetic resonance imaging scanner configured to generate a plurality of signals for forming at least one magnetic resonance image of a soft tissue region from a subject under observation, wherein the at least one magnetic resonance image provides at least one integrating feature to facilitate automatic segmentation; a signal processing system in communication with the magnetic resonance imaging scanner to receive the plurality of signals; and a data storage unit in communication with the signal processing system, wherein the data storage unit contains at least one template corresponding to the soft tissue region, wherein the signal processing system is adapted to process the plurality of signals received from the magnetic resonance imaging scanner to automatically perform segmentation for the soft tissue region of the subject under observation by utilizing the at least one template and the at least one integrating feature.

Some embodiments of the current invention provide a workstation, comprising: preprocessing engine to receive and preprocess magnetic resonance signals, from a magnetic resonance scanner, wherein the magnetic resonance signals form at least one magnetic resonance image showing a soft tissue region from at least one subject under observation in the magnetic resonance scanner; and a normalizing engine to automatically segment the soft tissue region by normalizing the formed at least one magnetic resonance image based on at least one template corresponding to the soft tissue region, wherein the at least one magnetic resonance image provides at least one integrating feature to facilitate automatic segmentation.

Some embodiments of the current invention provide a method comprising: receiving magnetic resonance signals for forming at least one magnetic resonance image showing a soft tissue region from a subject, wherein the at least one magnetic resonance image provides at least one integrating feature to facilitate automatic segmentation; preprocessing said magnetic resonance signals to generate at least one magnetic resonance image; receiving at least one template corresponding to the soft tissue region; and normalizing the generated at least one magnetic resonance image based on the at least one template to generate a segmented view of the soft tissue region.

Some embodiments of the current invention provide a computer readable medium, when executed by a computer, causes the computer to implement the method above.

BRIEF DESCRIPTION OF THE DRAWINGS

Further objectives and advantages will become apparent from a consideration of the description, drawings, and examples.

FIG. 6B shows an example of registering a brain image from an Alzheimer's patient to a template according to an embodiment of the current invention.

FIG. 6C shows an example of registering a template to a brain image from an Alzheimer's patient according to an embodiment of the current invention.

DETAILED DESCRIPTION

Some embodiments of the current invention are discussed in detail below. In describing embodiments, specific terminology is employed for the sake of clarity. However, the invention is not intended to be limited to the specific terminology so selected. A person skilled in the relevant art will recognize that other equivalent components can be employed and other methods developed without departing from the broad concepts of the current invention. All references cited herein are incorporated by reference as if each had been individually incorporated.

Figure 1:
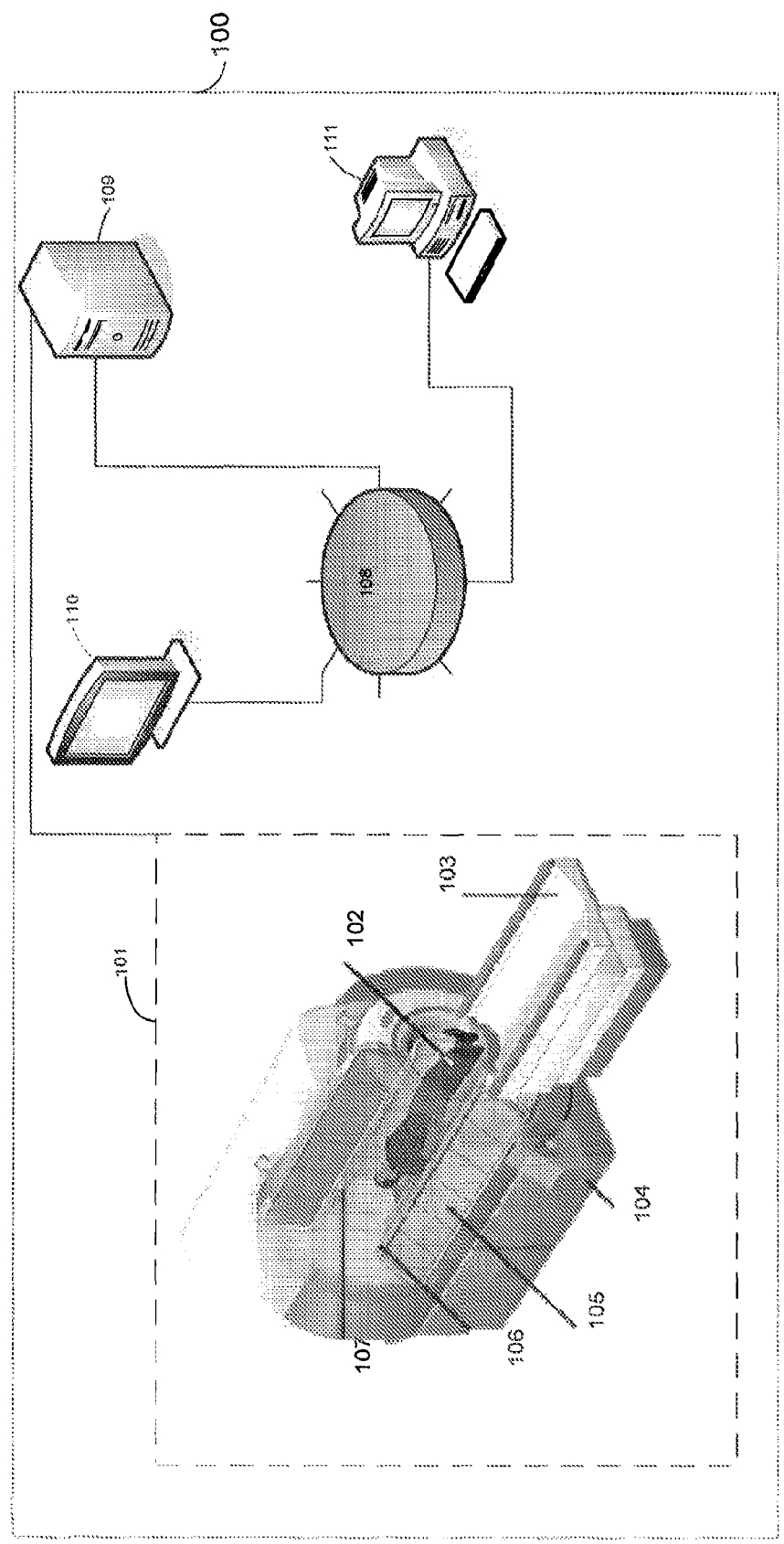
FIG. 1 is a schematic illustration of a magnetic resonance imaging (MRI) system according to an embodiment of the current invention.

FIG. 1 is a schematic illustration of a magnetic resonance imaging (MRI) system 100 according to an embodiment of the current invention The MRI system 100 includes a magnetic resonance scanner 101, a data storage unit 108, and a signal processing unit 109. Magnetic resonance scanner 101 has a main magnet 105 providing a substantially uniform main magnetic field $B_0$ for a subject 102 under observation on scanner bed 103, a gradient system 106 providing a perturbation of the main magnetic field $B_0$ to encode spatial information of the constituent water molecules of subject 102 under observation, and a radiofrequency (RF) coil system 107 to transmit electromagnetic waves and to receive magnetic resonance signals from subject 102. Magnetic resonance scanner 101 is configured to generate magnetic resonance signals that facilitate subsequent analysis including segmentation.

Data storage unit 108 stores template data corresponding to a soft tissue region of subject 102 under observation. The soft tissue region may be, for example, a brain, a heart, a muscle, etc. The template data comprises at least one template. A template of a soft tissue region may be derived from, for example, a plurality of magnetic resonance images from a subpopulation with similar characteristics to that of subject 102. For example, template data can come from the same age group as subject 102 in some applications. This is because each age range may have different tissue shapes and contrasts. For example, the human brain undergoes considerable shape and contrast changes during the first 24 months of age. During this period, templates should be created with a small range of ages (e.g., 0-1 month, 1-2 months, 2-4 months, etc.). On the other hand, however, the brain undergoes aging processes which become apparent approximately after age 60. Therefore additional templates may be required for an older subpopulation. A template may include magnetic resonance images from at least one subject that is different from subject 102 under observation. A template may include magnetic resonance images from a previous scan of subject 102 under observation. For example, one template may be derived from $T_1$-weighted images suitable for the cortex and deep gray matter structures, a second template may be derived from $T_2$-weighted images having higher contrasts for ventricles, and a third template may be derived from diffusion tensor images in which intra-white matter structures are best delineated. The term template data is thus defined and shall be understood consistently throughout the confines of this paper.

Data storage unit 108 may be, for example, a hard disk drive, a network area storage (NAS) device, a redundant array of independent disks (RAID), a flash drive, an optical disk, a magnetic tape, a magneto-optical disk, etc. However, the data storage unit 108 is not limited to these particular examples. It can include other existing or future developed data storage devices without departing from the scope of the current invention.

A signal processing system 109 is in communication with magnetic resonance scanner 101 to receive magnetic resonance signals for forming magnetic resonance images of subject 102. Signal processing system 109 may be partially or totally incorporated within a structure housing magnetic resonance scanner 101. Signal processing system 109 may be at least partially incorporated in a workstation that is structurally separate from and in communication with magnetic resonance scanner 101. Signal processing system 109 may be incorporated in a workstation that is structurally separate from and in communication with magnetic resonance scanner 101. Magnetic resonance signals received by signal processing system 109 may be associated with a magnetic resonance contrast parameter, such as, for example, a relaxation time $T_1$, a relaxation time $T_2$, an apparent diffusion coefficient, a property associated with the blood oxygenation level dependent (BOLD) effect, a property associated with the diffusion tensor, etc.

Signal processing system 109 is in communication with data storage unit 108. By utilizing the template data stored on data storage unit 108, signal processing system 109 is capable of processing the magnetic resonance signals received from magnetic resonance scanner 101 to automatically segment a soft tissue region within the magnetic resonance images of subject 102. The results may be displayed on a viewing station 110 or a console station 111. The segmentation results may be used for further image analysis and disease diagnosis.

Figure 2:
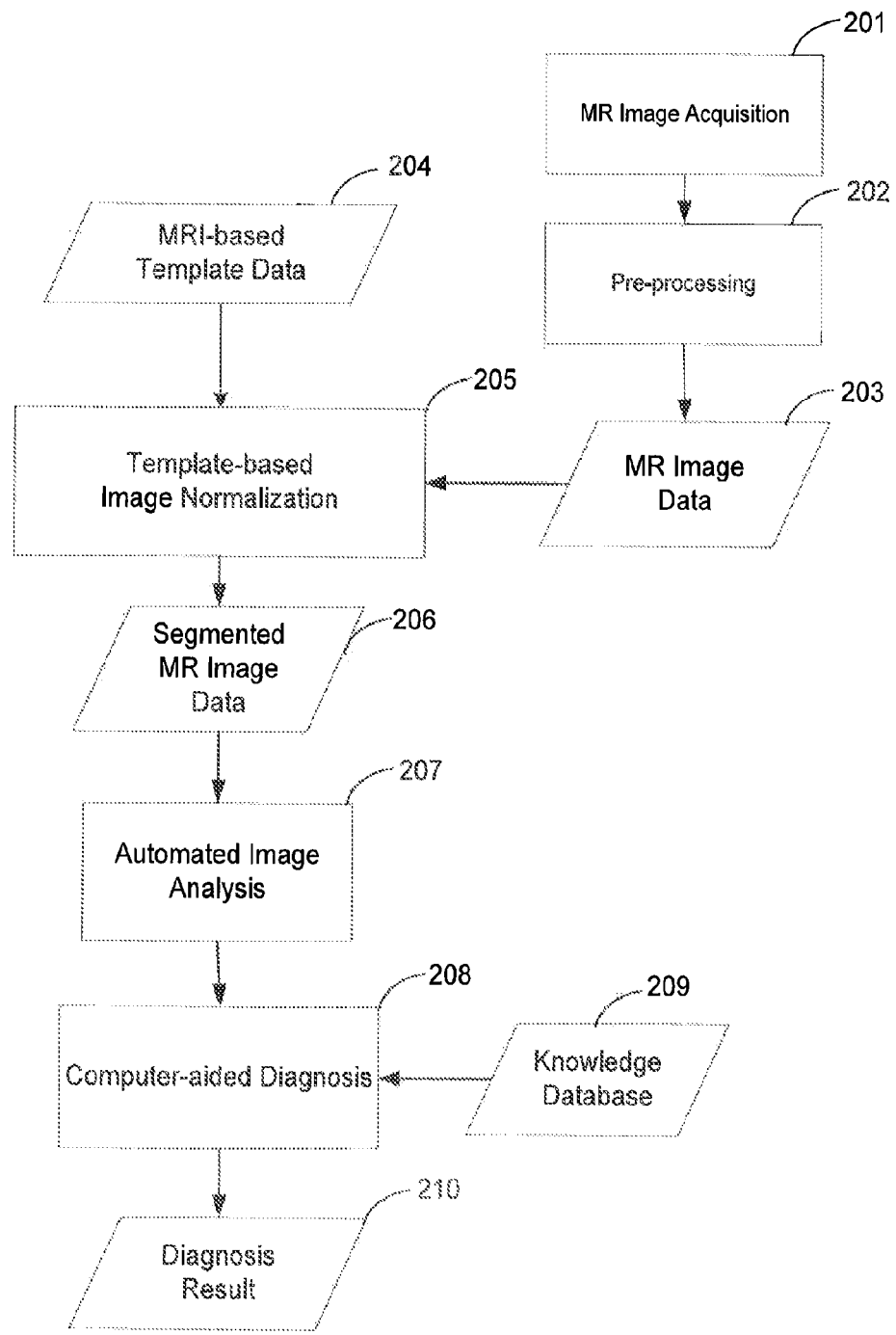
FIG. 2 is a flow chart to facilitate the explanation of an embodiment of the current invention.

FIG. 2 is a flow chart to help describe an embodiment of the current invention.

In block 201, magnetic resonance signals that may include an integrating feature to facilitate subsequent analysis including segmentation are acquired from magnetic resonance scanner 101. The integrating features may be provide by techniques that include but are not limited to intensity homogeneity corrections, multi-contrast, skull-suppression contrast, and quantitative parameterization.

Intensity homogeneity corrections may ensure that the intensity profile on the imaged object is homogeneous, which facilitate the efficiency and accuracy of subsequent image analysis. Examples of intensity homogeneity corrections may include but are not limited to: for example, proper shimming, judicious choices of RF coils with more uniform sensitivity profiles, use of reference phantoms, etc.

Multi-contrast may include contrasts associated with $T_1$, $T_2$, $T_2^*$, proton-density, apparent diffusion, perfusion, diffusion tensor, etc. The contrasts may be realized by including inversion-recovery pre-pulses (also known as preparation pulses in the literature). Each contrast delineates brain structures differently. For example, $T_1$ may provide high differentiation between gray and white matter and $T_2$ may define the ventricles better. It is noted that integration with detailed imaging parameters, such as echo time, repetition time, inversion recovery time, field of view, and imaging matrix, etc., may further ensure standardized image quality of analyzed images.

Skull-suppression contrast may include approaches to suppress magnetic resonance signals from adjacent tissues such as dura, fat, and skin, etc. In general, signal intensity associated with a magnetic resonance image is affected by various physical and chemical properties of water molecules such as $T_1$, $T_2$, $T_2^*$, proton density, perfusion, and diffusion. Magnetic resonance signal intensity from a spin-echo sequence may be described as:

$$S = PD \cdot (1 - e^{TR/T_1}) \cdot e^{-TE/T_2} \cdot e^{-bD} \quad (1),$$

where PD is proton density signal, TR is repetition time, TE is echo time, b is a factor due to a pair of diffusion encoding gradients associated with a spin echo imaging sequence. D is the diffusion coefficient. Example approaches may, for example, include judicious choice of TRs and TEs to minimize magnetic resonance signals from non-brain tissues. Example approaches may also utilize the shift in resonance frequency of signals from fat and non-fat tissues to suppression fat signals.

Quantitative parameterization may include parameterization of signals associated with magnetic resonance images. For example, by acquiring more than one magnetic resonance image with different imaging conditions, parameters such as $T_1$, $T_2$, and diffusion coefficient D may be quantified by using magnetic resonance sequences. Diffusion coefficient D may be quantified as, for example, an apparent diffusion coefficient (ADC), a diffusion tensor (DT), a quantity associated with the diffusion tensor matrix, etc. In general, parameterization may ease comparison between two images from different subjects or scanners.

In block 202, magnetic resonance signals acquired are pre-processed to generate magnetic resonance image data 203.

For example, preliminary brain segmentation may be performed by intensity thresholding or region growing using an acquired skull-suppressed magnetic resonance image to roughly define, for example, a brain.

For example, template-based refinement may then be performed by morphing a binary brain template to the preliminarily segmented brain in order to remove, for example, various non-brain tissues remaining in the preliminarily segmented brain image.

For example, the refined brain segmentation results may be used as masking to automatically remove non-brain tissue in co-registered magnetic resonance images acquired from the same subject 102.

For example, the above segmented image may be used as a template to correct distortions contained in some magnetic resonance images. The distortions may be due to $B_0$ inhomogeneity resulting from, for example, sharp susceptibility differences at interfaces of tissue and air. For example, a segmented skull-suppressed image may be used as a template to which images containing distortion may be non-linearly and automatically warped using such algorithms as Large Deformation DiffoMorphism Metric (LDDMM).

MRI-based template data 204 may reside on data storage unit 108. MRI-based template data 204 may be created by using magnetic resonance images from a single subject or probability-based images from many subjects, encoding the spatial probability of a soft tissue. The images may show segmented tissues of interest based on various signal contrast such as, for example, $T_1$, $T_2$, $T_2^*$, proton density, diffusion, perfusion, blood oxygenation level dependent (BOLD), etc.

In block 205, MR image data 203 is normalized based on MRI-based template data 204 to generate segmented MR image data 206. The normalization may include non-linear warping of template data 204 to image data 203 using, for example, large deformation diffomorphic metric (LDDMM). The normalization may also match template data 204 with image data 203 based on signal contrast (e.g., $T_1$ to $T_1$, $T_2$ to $T_2$, and diffusion to diffusion, etc.) in a multi-channel manner. Segmented MR image data 206 may be used in a number of applications. For example, to calculate the volume of a soft tissue of interest in segmented MR image data 206, one may simply count the number of pixels within the morphed segments.

In block 207, automated analysis based on segmented MR image data 206 may be performed. Automated analysis may analyze the transformation matrix to retrieve quantitative data about brain shapes. For example, Jacobian maps associated with the morphing of template data 204 to MR image data 206 may be calculated to reveal local tissue shrinkage and enlargement compared to the template. For example, the transformation matrix associated with morphing an image in MR image data 206 to template data 204 may be applied to other images showing different contrast, and quantitative parameterized maps such as $T_1$, $T_2$, diffusion coefficient D, etc. The application may allow further and quantitative analyses to detect signal abnormalities.

In block 208, results from block 207 may be compared with knowledge database 209 to generate diagnosis result 210. Knowledge database 209 may be include, for example, volumes of segmented tissues, morphological maps, and photometric maps from a normal population of similar age range. Averages and standard deviations of quantitative measures derived from magnetic resonance data of the normal population may be included as well. Knowledge database 209 may also include volumes of segmented tissues, morphological maps, and photometric maps from a clinical population of similar age range diagnosed as patients. The term knowledge data base is thus defined and shall be understood consistently within the confines of this paper. The comparison of results from block 207 with knowledge database 209 may be implemented using correlation techniques such as, for example, the t-test, p-test, Statistical Analysis Software (SAS), etc. If diagnosis result 210 is positive, then results from block 207 being compared may be added to knowledge database 209 as part of the data corresponding to the clinical population. The quantitative results from block 207 and data from the normal population of similar subject group contained in knowledge database 209 may also be displayed, for example, on console station 110 or workstation 111, for a user, for example, a clinician, to make a diagnosis.

Some embodiments of the current invention may include a computer readable medium, which when executed by a computer, implements the flow chart in FIG. 2. A computer readable medium may refer to any storage device used for storing data accessible by a computer. Examples of computer readable mediums may include but are not limited to: a magnetic hard disk; a floppy disk; an optical disk, such as a CD-ROM and a DVD; a magnetic tape; and a memory chip.

Figure 3A:
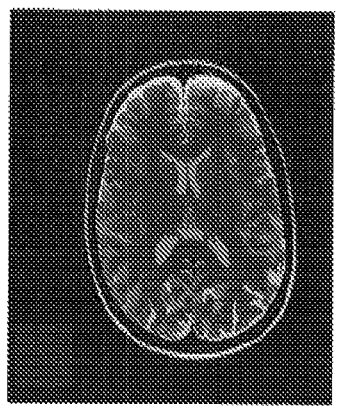
FIG. 3A shows a magnetic resonance image with $T_2$ weighting.

FIG. 3A shows an example magnetic resonance image with $T_2$ weighting. Pixels with brighter intensities tend to associate with longer $T_2$s.

Figure 3B:
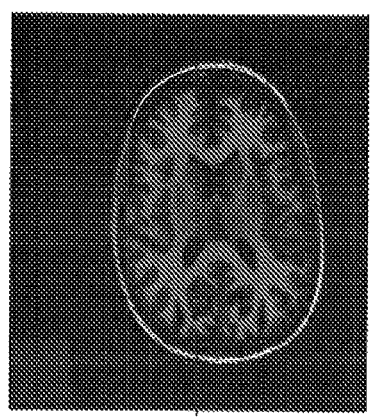
FIG. 3B shows a magnetic resonance image with $T_1$ weighting.

FIG. 3B shows an example magnetic resonance image with $T_1$ weighting. Pixels with brighter intensities tend to associate with shorter $T_1$s.

Figure 3C:
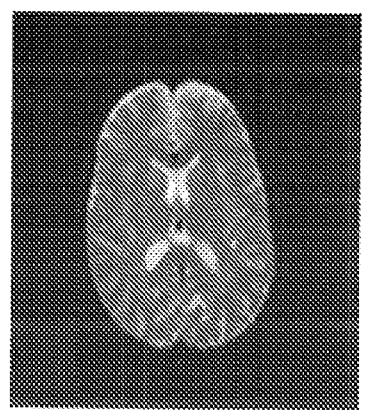
FIG. 3C shows a magnetic resonance image with skull suppression.

FIG. 3C shows an example magnetic resonance image with skull suppression. The skull suppression may be achieved, inter alia, via fat suppression MR sequences to null MR signals from subcutaneous fat.

Images of similar contrasts to FIGS. 3A-3C may be acquired and pre-processed according to an embodiment of the current invention.

Figure 4A:
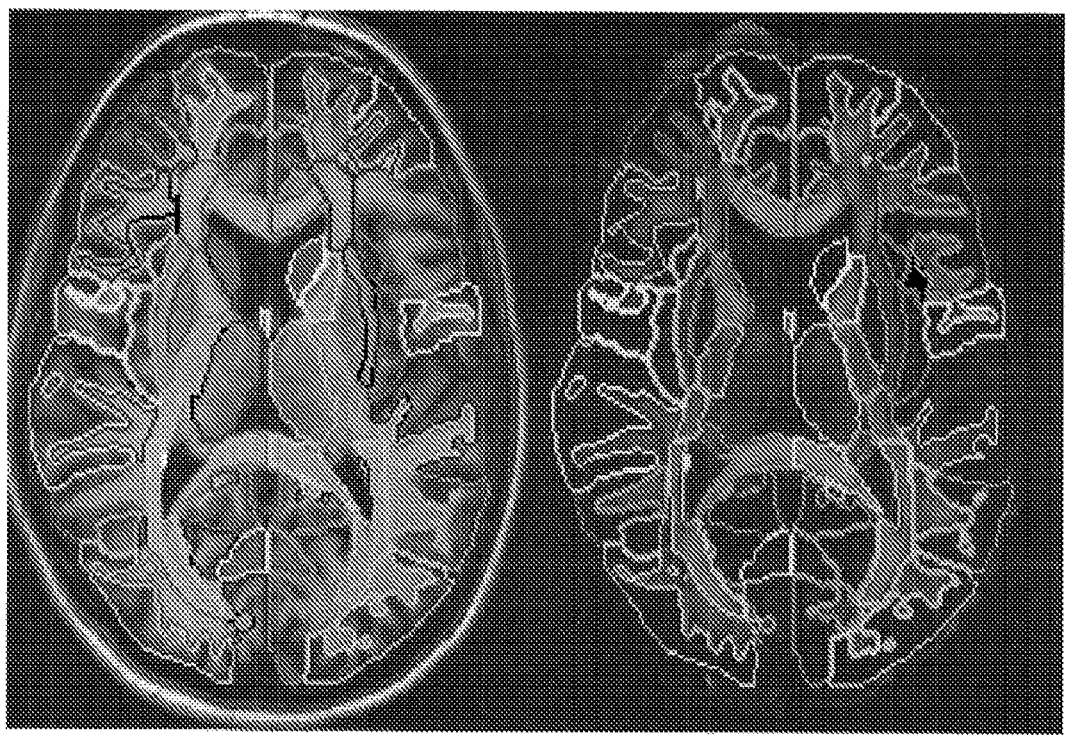
FIG. 4A shows a 2-dimensional (2-D) view of a brain template example according to an embodiment of the current invention.

FIG. 4A shows a 2-dimensional (2-D) view of a brain template example according to an embodiment of the current invention. Based on $T_1$-weighted and diffusion tensor imaging (DTI) contrasts, the brain is segmented into 176 anatomical areas.

Figure 4B:
FIG. 4B shows a 3-dimensional (3-D) view of a brain template example according to an embodiment of the current invention
Figures 5A, 5B, 5C, 5D:
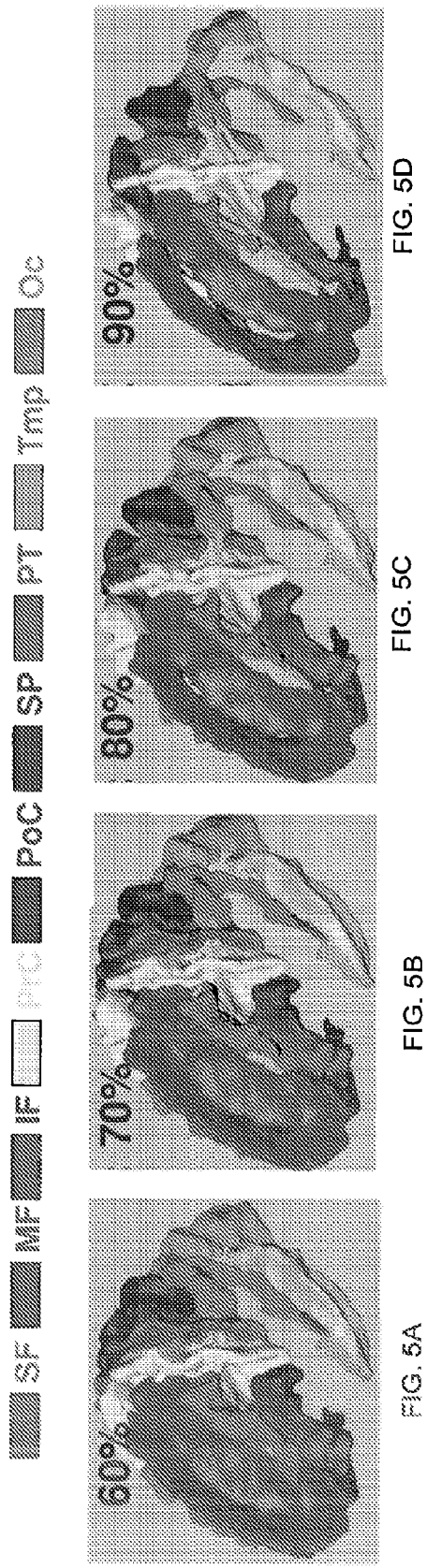
FIG. 5A shows an example of a probabilistic map according to an embodiment of the current invention for peripheral white matter (PWM) with greater than 60% probability.
FIG. 5B shows an example of a probabilistic map according to an embodiment of the current invention for peripheral white matter (PWM) with greater than 70% probability.
FIG. 5C shows an example of a probabilistic map according to an embodiment of the current invention for peripheral white matter (PWM) with greater than 80% probability.
FIG. 5D shows an example of a probabilistic map according to an embodiment of the current invention for peripheral white matter (PWM) with greater than 90% probability.

FIG. 4B shows a 3-dimensional (3-D) view of the same brain template example according to an embodiment of the current invention. The template is visualized as three anatomical regions, namely, the Gray Matter (GM), the Peripheral White Matter (PWM), and Core White Matter (CWM).

In the example above, the brain is divided into 176 anatomical areas based on $T_1$-weighted and diffusion tensor imaging (DTI) contrasts. Among them, there are 80 GM areas, 46 PWM areas, and 50 CWM areas. In particular, the segmentation of gray matter structures was based on information from $T_1$-weighted images while the segmentation of white matter structures was partially based on information from diffusion tensor imaging (DTI). Specifically, the gray matter, including the cortex and the basal ganglia, was segmented using $T_1$-weighted Magnetization-Prepared Rapid Gradient Echo (MPRAGE) images. The CWM areas were defined using DTI images based on two criteria. First, these areas were well characterized in past anatomical studies. Second, their sizes and locations were well-defined and highly reproducible among normal subjects. The white matter that fills the space between the cortex of the gray matter and the core white matter is the Peripheral White Matter (PWM). PWM areas are further subdivided based on the cortical segmentation.

In the example above, the brain template, as one embodiment of the current invention, may be referred to as a "Level 1" template in which the brain from a single subject is divided into a number of anatomical units. The data for the brain template in the example above was obtained from a 32-year-old healthy female subject without previous neurological disorders. A 1.5T MR unit (Gyroscan NT, Philips Medical Systems) was used.

DTI data were acquired using single-shot echo-planar imaging sequences with sensitivity encoding (SENSE) and a parallel imaging factor of 2.5 (Pruessmann et al., 1999 SENSE: sensitivity encoding for fast MRI. Magn Reson Med 42, 952-962). The imaging matrix was 112×112 in k-space, with a field of view of 246×246 min and an accompanying nominal resolution of 2.2 mm. The image matrix was zero-filled to 256×256 pixels in k-space prior to reconstruction. Transverse image slices were acquired at 2.2 mm slice thickness and were parallel to the anterior commissure-posterior commissure line (AC-PC). A total of 60 image slices covered the entire hemisphere and brainstem with no gaps. Diffusion weighting gradients were applied along 30 independent orientations (Jones et al., 1999) with an accompanying b-value of 700 mm$^2$/s. Five additional images with minimal diffusion weighting (b=33 mm$^2$/sec) were also acquired. To enhance the signal-to-noise ratio, imaging was repeated six times. For anatomical guidance in each slice location, double-echo (echo time of 40 and 100 ms) Fast Spin-Echo (FSE) images and one Magnetization-Prepared Rapid Gradient Echo (MPRAGE) image with 1 mm image resolution were recorded and co-registered.

The raw diffusion-weighted images (DWIs) were first co-registered to one of the images with the minimal diffusion weighting and was corrected for subject motion and eddy current distortion using a 12-mode affine transformation of Automated Image Registration (AIR) (Woods et al., 1998. Automated image registration: 1. General methods and intra-subject, intramodality validation. J Comput Assist Tomogr 22, 139-152). $B_0$-susceptibility distortion was corrected by non-linear warping using the FSE (echo time of 100 ms) image with the minimal diffusion weighting (Huang et al., 2005. Magn. Reson. Imaging, 26, 1294-1302). For the non-linear warping, a Large Deformation Diffeomorphic Metric Mapping (LDDMM) was used (Miller e al., 1997. Stat Methods med Res, 6, 267-299). The warping was applied to all raw DWIs, which were then re-sliced to 1 mm isotropic resolution (246×246×121 matrix). The six elements of the diffusion tensor were calculated for each pixel with multivariate linear fitting using DtiStudio (Jiang et al., 2006, Comput Methods Programs Biomed, 81, 106-116). After diagonalization, three eigenvalues and eigenvectors were obtained. For the anisotropy map, fractional anisotropy (FA) was used (Pierpaoli and Basser, 1996. Toward a quantitative assessment of diffusion anisotropy. Magn. Reson. Med. 36, 893-906.).

The Level 1 template above, was created based on the International Consortium of Brain Mapping (ICBM-152) template coordinates. A Johns Hopkins University(JHU)-DTI template was transformed to the ICBM-152 template using a simple affine transformation. The native MPRAGE image was also transformed to the ICBM-152. The transformation matrix was then applied to the calculated diffusion tensor field of the JHU-DTI atlas using the method described by (Alexander et al., 2001, IEEE Trans Med imaging 20, 1131-1139) and (Xu et al., 2002, Magn Reson Med, 50, 175-182).

While the Level 1 template above contains anatomical information in great detail, it may contain subject-specific anatomical information (such as cortical folding pattern), which may not be distinguished from structures that are reproducible among subjects. A "Level 2" template, however, incorporates information about the probability of each anatomical structure within the template over a population (Mori et al., 2008, Neuroimage, 40, 570-582, Mori et al. PCT/US/2009/000011, Automatic Fiber Tracking of Human Brain White Matter Using Diffusion Tensor Imaging). The contents of this patent application is incorporated herein by reference. The notion of probability (or reproducibility) can be important for the PWM and the cortex of gray matter. To generate the probabilistic maps of the PWM, the white matter of 30 normal subjects were segmented and registered to the Level 1 template using LDDMM. By lumping the 30 registered segmentation maps, the spatial probability of white matter can be calculated at each Montreal Neurological Institute (MNI) coordinate. The probabilistic map, obtained from multiple subjects, may be referred to as a Level 2 template.

FIG. 5A-5D show examples of probabilistic maps, according to an embodiment of the current invention, for peripheral white matter (PWM) with greater than 60%, 70%, 80%, and 90% probabilities.

Using the Level 2 template above, the basal ganglia, the CWM, and the PWM can be defined automatically in a given subject. Once the template is successfully applied to a subject, it is straightforward to measure quantities such as volumes and MR contrast parameters ($T_1$, $T_2$, $T_2^*$, ADC, fractional anisotropy, eigenvalues, etc.) for a given segmented region or area. In the Level 2 template, quantitative measures such as the average and standard deviation values may be defined in a segmented region or area, with which the patient values can be compared. It may be possible to segment and analyze each and every substructure of, for example, the cortex, with satisfactory accuracy and precision. However, embodiments of the current invention, with only the cortex areas segmented, can still produce sufficient anatomical information about the cortex, such as proportions and volumes of the cortical areas.

Once the template boundary is defined based on a population-probabilistic map (e.g., 90% white matter), it may be much easier to identify corresponding common white matter areas across subjects, compared to the Level 1 template based on a single subject.

Figure 6A:
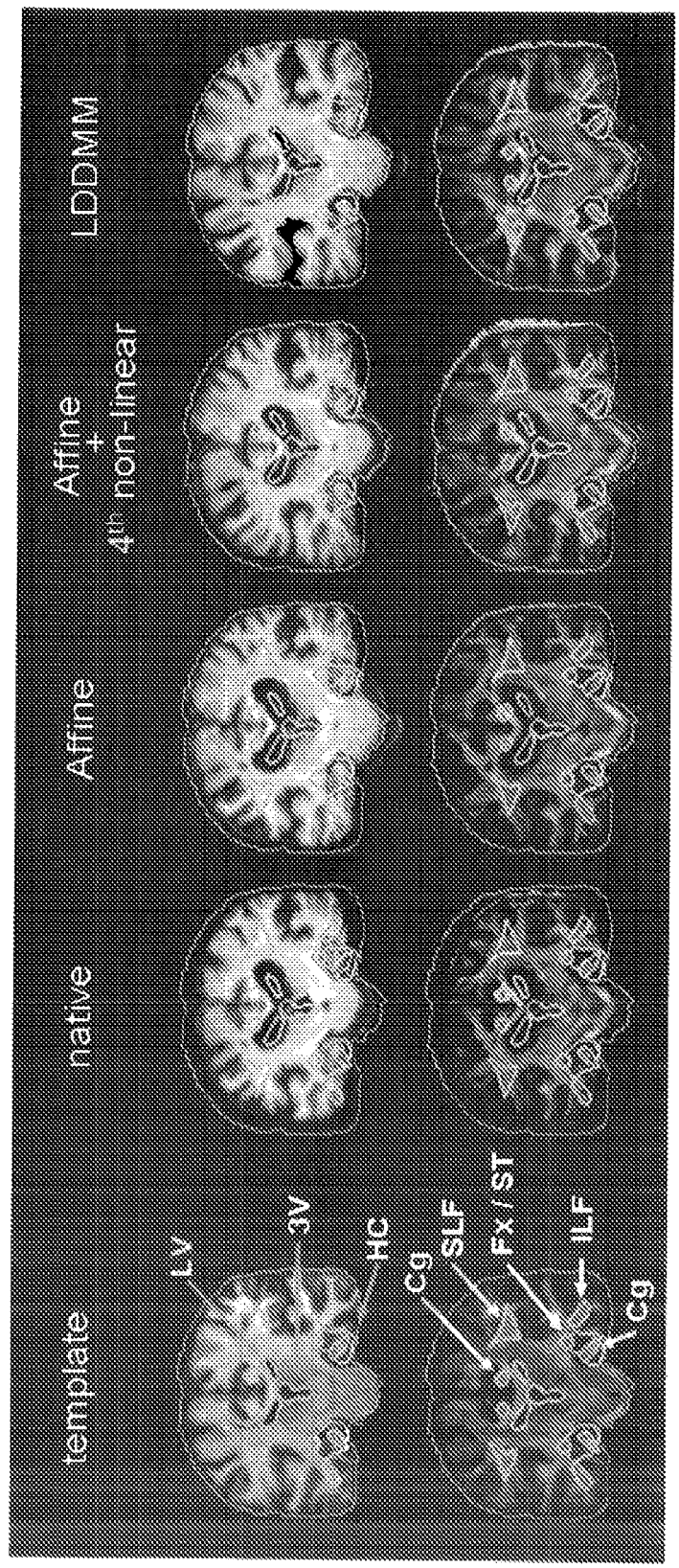
FIG. 6A shows examples of registering the brain images from an Alzheimer's patient to a template according to an embodiment of the current invention.

FIG. 6A shows examples of normalizing the brain images from an Alzheimer's patient based on a template according to an embodiment of the current invention. The normalization maps the patient's image data to our template data. Once the normalization of the subject brain images to the template is completed, the pre-segmented substructures, for example, the 176 segmented brain areas defined within the templates above, can be automatically transferred and superimposed on the image data of a given patient. Since the segmented brain areas are now fitted to the data from the subject, quantities of physiological interest within a segmented area of the subject may be measured. The quantities may include but are not limited to: volumes, shapes, and various MR contrast parameters, such as $T_1$, $T_2$, diffusion coefficient D, etc.

A transformation algorithm, called Large Deformation Diffeomorphic Metric Mapping (LDDMM) (Miller et al., 1993, Proc Natl Acad Sci, 90, 1194-11948; Joshi et al., 1995, Geometric methods in Applied Imaging, San Diego, Calif.; Granander and Miller, 1996, Statistical computing and graphics newsletter 7, 3-8), may be used during the normalization. There can be several important technically attractive features of LDDMM. First, LDDMM is highly non-linear and can match the shapes of two brains, as demonstrated in FIG. 6A. It can even transform a brain with severe atrophy. Second, LDDMM can achieve topology preservation. Topology preservation may be an very important feature when applying a morphing algorithm to a biological entity. For example, when morphing one face to another, if topology is not preserved, non-biological results (e.g., two eyes become three eyes) can occur. Third, the transformation can be reciprocal. It is noted that other transformation algorithm that can generate image transformation and preserve tissue topology can be used instead of LDDMM. In some cases, e.g. only subtle changes in soft tissue region are expected, the requirement of topology preserving can be waived.

Normalizing an image based on a template may be performed by registering the image to the template or by registering the template to the image. FIG. 6B shows an example of registering a brain image from an Alzheimer's patient to a template according to an embodiment of the current invention using LDDMM. The patient image is registered to the template and the boundaries of segmented structures boundaries in the template are superimposed on the patient image.

FIG. 6C shows an example of registering a template to a brain image from an Alzheimer's patient, according to an embodiment of the current invention using LDDMM. The brain segmentation data in the template is transformed to the patient image for automated segmentation. This approach can avoid deformation and interpolation of the patient image. Volume measurement of each segmented area in the patient image can also be more straightforward.

In FIG. 6B, an example of registering a patient image to a template is shown. However, for the automated quantification of individual patients, the registration of a template to a patient image, as shown in FIG. 6C, may provide more intuitive results. By using LDDMM, the two registrations may be reciprocal.

The LDDMM algorithm computes a transformation, $\Phi:\Omega \rightarrow \Omega$, between two image spaces, where $\Omega \subset R^3$ is the 3D cube by which the data is defined. The transformation computed by LDDMM is generated as the end point, $\phi=\phi_1$, of the flow of smooth time-dependent vector fields, $v_1$, with the ordinary differential equation, $\hat{\phi}_t=v_t, t\epsilon[0.1]$, where $\Phi_0(x)=x$, $x\epsilon\Omega$.

Smoothness of the vector fields, $v_1$, may ensure that the computed transformation is a diffeomorphism. This smoothness condition may be enforced with a regularization term based on constraints induced by a suitable Sobolev norm, denoted as $\|v\|_v$. The generic inexact matching problem may be formulated as the following equation:

$$\hat{\varphi} = \underset{\varphi=\phi_1; \hat{\phi}_t=v_t \circ \phi_t, t\in[0,1]}{\operatorname{argmin}} \int_0^1 \|v_t\|_V^2 \, dt + D(\varphi) \quad (1)$$

where $D(\phi)$ is a matching term between the transformed source and target data. Depending on the input data (landmarks, scalar valued images, vector-valued images or tensor-valued images), different versions of LDDMM can be defined with different matching terms.

To determine the best correspondence between one or several scalar observations on $\Omega$, denoted $I_{01}, \ldots, I_{0C}$ for the source and $I_{11}, \ldots, I_{1C}$ for the target, one can choose, for example:

$$D(\varphi) = \sum_{c=1}^{C} \frac{1}{\sigma_c^2} \int_\Omega (I_{0c} - I_{1c})^2 \, dx.$$

An example minimization algorithm, (Beg Et Al., 2005, International Journal of Computer Vision, 61, 139-157), implements a gradient descent procedure with respect to the time-dependent vector field, $v_t$. For the source image, one can test LDDMM using five channels of data, including, for example, MPRAGE, proton density (TE=40 ms), T2-weighted (TE=100 ms), ADC maps, and fractional anisotropy maps.

The accuracy of automated quantitative analysis may depend on the quality of image registration. A high quality registration may manifest as the shapes of the two images being matched as closely as possible. To achieve the closest matching in shape, non-linear image transformation may be used. Because the shapes of two images are often very different, a "large deformation" transformation may be used. An aspect of the LDDMM is that it allows large deformation while maintaining the topology of the object. For example, one topologically spherical object (e.g., the thalamus) may remain as one object. This simple condition is not always present for various types of non-linear transformations. For example, one part of the thalamus may be detached from the other after a non-linear transformation, resulting in two separate (one large and one small) thalamic objects. The inability to maintain topology may occur more often as the elasticity of non-linear warping increases, which may be needed by conventional non-linear transformation algorithms to achieve excellent shape matching.

Figure 6D:
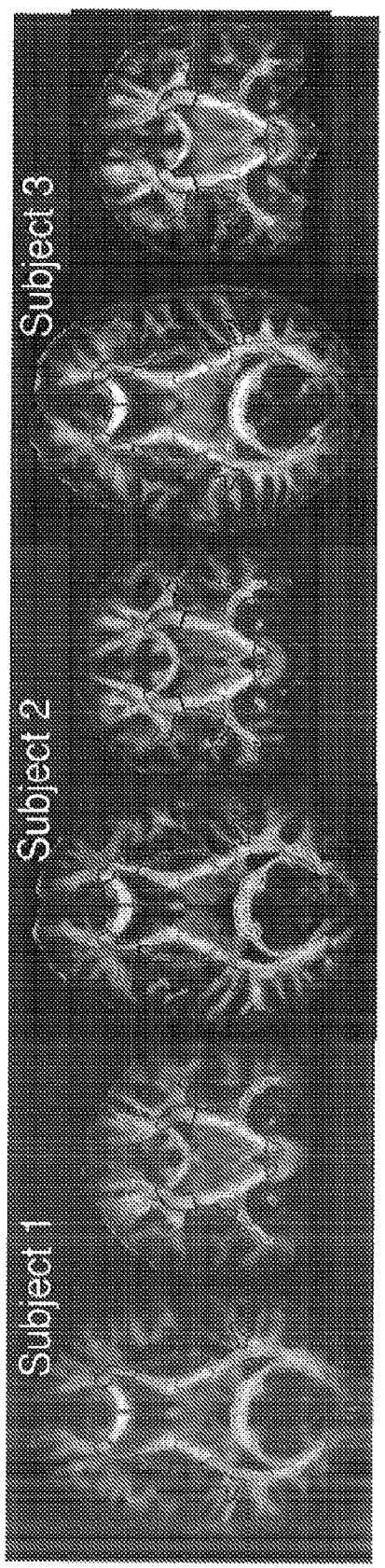
FIG. 6D shows examples of automated brain segmentation according to an embodiment of the current invention.

FIG. 6D shows examples of automated brain segmentation according to an embodiment of the current invention. Results from three subjects are shown using the LDDMM registration algorithm and Level 2 template with 90% probabilistic maps. Thus, using the Level 2 template, one may define the basal ganglia, the CWM, and the PWM automatically. Once the template is successfully applied to a given subject, it is straightforward to measure quantities such as volumes and MR contrast parameters (for example, $T_1$, $T_2$, $T_2^*$, ADC, fraction anisotropy, eigenvalues of the diffusion tensor, etc.) for a segmented area in an image of the subject.

Figure 7:
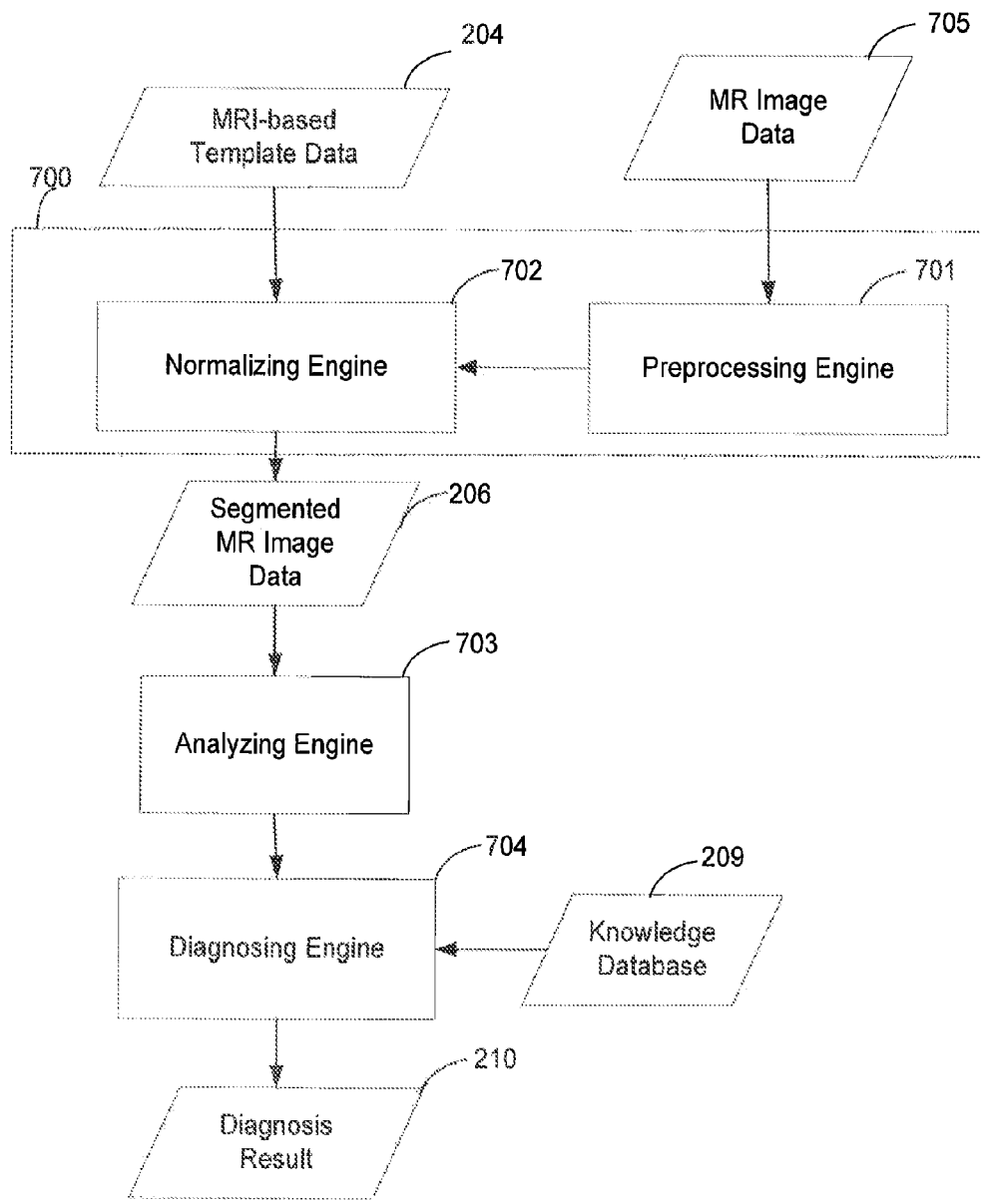
FIG. 7 is a schematic illustration of a workstation according an embodiment of the current invention.

FIG. 7 is a schematic illustration of a workstation according an embodiment of the current invention. Workstation 700 may comprise preprocessing engine 701 and normalizing engine 702.

Preprocessing engine 701 may, for example, perform preliminary automated brain segmentation on MR signals 705 by intensity thresholding or region growing using an acquired skull-suppressed magnetic resonance image to roughly define, tier example, a brain. Preprocessing engine 701 may, for example, perform template-based refinement of automated brain segmentation by morphing a binary brain template to the roughly segmented brain in order to remove, for example, various non-brain tissues remaining in the roughly segmented brain image. Preprocessing engine 701 may, for example, use the refined brain segmentation results as masking to automatically remove non-brain tissue in co-registered magnetic resonance images acquired alike. Preprocessing engine 701 may, for example, use the above segmented image as a template to correct distortions contained in some magnetic resonance images. The distortions may be due to $B_0$ inhomogeneity resulting from, for example, sharp susceptibility differences at interfaces of tissue and air. Preprocessing engine 701 may, for example, further use the segmented skull-suppressed image as a template to which images containing distortion may be non-linearly and automatically warped using algorithms such as LDDMM.

Normalizing engine 702 may normalize the results from preprocessing engine 701 based on MRI-based template data 204 to generate segmented MR image data 206. Normalizing engine 702 may perform non-linear warping using, for example, large deformation diffomorphic metric (LDDMM). Normalizing engine 702 may also match template data 204 with the results from preprocessing engine 701 based on signal contrast (e.g., $T_1$ to $T_1$, $T_2$ to $T_2$, and diffusion to diffusion, etc.) in a multi-channel manner.

Workstation 700 may further comprise analyzing engine 703 that analyzes the transformation matrix associated with morphing to retrieve quantitative data about brain shapes. For example, analyzing engine 703 may analyze Jacobian maps associated with the morphing of template data 704 to MR image data 206 to reveal local tissue shrinkage and enlargement compared to the template. For example, analyzing engine 703 may apply the transformation matrix, associated with morphing an image in the results from preprocessing engine 701 to template data 204, to other images showing different contrast as well as quantitative parameterized maps of for example, $T_1$, $T_2$, diffusion, etc. Thus, the application of the transformation matrix may allow further anti quantitative analyses to detect signal abnormalities.

Workstation 700 may further comprise diagnosing engine 704 that compares the results from analyzing engine 703 with knowledge database 209 to generate diagnosis result 210. Diagnosing engine 704 may correlate the results from analyzing engine 703 with knowledge database 209 by incorporating such statistical tools as the t-test, p-test, SAS, etc. If diagnosis result 210 is positive, then diagnosing engine 304 may add the diagnosis result 210 being generated to knowledge database 209. The quantitative results in diagnosis results 210 and quantitative data from knowledge database 209 may also be displayed, for example, on console station 110 or workstation 111, for a user, for example, a clinician, to make a diagnostic decision.

Workstations 700 may be a computer with at least one central processing unit (CPU) and a plurality of memories. Workstations 700 may also be a dedicated processing machine with such devices as, for example, a field programmable gated array (FPGA), a digital signal processing (DSP) chip, a graphic processing unit (GPU), an application specific integrated circuit (ASIC), etc.

Preprocessing engine 701, normalizing engine 702, analyzing engine 703, and diagnosing engine 704 may be implemented by a computer with at least one central processing unit (CPU) and a plurality of memories. Preprocessing engine 701, normalizing engine 702, analyzing engine 703, and diagnosing engine 704 may be implemented as, for example, a field programmable gated array (FPGA), a digital signal processing (DSP) chip, a graphic processing unit (GPU), an application specific integrated circuit (ASIC), etc.

In describing embodiments of the invention, specific terminology is employed for the sake of clarity. However, the invention is not intended to be limited to the specific terminology so selected. The above-described embodiments of the invention may be modified or varied, without departing from the invention, as appreciated by those skilled in the art in light of the above teachings. It is therefore to be understood that, within the scope of the claims and their equivalents, the invention may be practiced otherwise than as specifically described.

We claim:

1. A magnetic resonance imaging (MRI) system, comprising:
    a magnetic resonance imaging scanner configured to generate a plurality of signals for forming at least one magnetic resonance image of a soft tissue region from a subject under observation, wherein said at least one magnetic resonance image provides at least one integrating feature to facilitate automatic segmentation;
    a signal processing system in communication with said magnetic resonance imaging scanner to receive said plurality of signals;
    and a data storage unit in communication with said signal processing system, wherein said data storage unit contains at least one template corresponding to said soft tissue region,
    wherein said signal processing system is adapted to process said plurality of signals received from said magnetic resonance imaging scanner to automatically perform segmentation for said soft tissue region of said subject under observation by utilizing said at least one template and said at least one integrating feature,
    wherein performing said segmentation further comprises:
    transferring segmentation data from the at least one template to the at least one magnetic resonance image using a three-dimensional diffeomorphic transformation; and performing segmentation using the transferred segmentation data.

2. The magnetic resonance imaging system according to claim 1, wherein said at least one integrating feature provided by said at least one magnetic resonance image facilitates discerning said soft tissue region by at least one of: a correction of intensity homogeneity; a plurality of contrasts; a suppression of at least one tissue component; a quantification of at least one magnetic resonance (MR) contrast parameter, or variations thereof.

3. The magnetic resonance imaging system according to claim 1, wherein said signal processing system is at least partially incorporated within a structure housing said magnetic resonance scanner.

4. The magnetic resonance imaging system according to claim 1, wherein said signal processing system is at least partially incorporated in a workstation that is structurally separate and in communication with said magnetic resonance imaging scanner.

5. The magnetic. resonance imaging system according to claim 1, wherein said at least one template is obtained from magnetic resonance imaging.

6. The magnetic resonance imaging system according to claim 1, wherein said at least one template incorporates at least one magnetic resonance image from at least one subject that is different from said subject under observation.

7. The magnetic resonance imaging system according to claim 1, wherein said at least one template incorporates at least one magnetic resonance image from a previous scan of said subject under observation.

8. A workstation, comprising:
a preprocessing engine to receive and preprocess magnetic resonance signals, from a magnetic resonance scanner, wherein said magnetic resonance signals form at least one magnetic resonance image showing a soft tissue region from at least one subject under observation in said magnetic resonance scanner; and
a normalizing engine to automatically segment said soft tissue region by normalizing the formed at least one magnetic resonance image based on at least one template corresponding to said soft tissue region,
wherein segmentation data is transferred from the at least one template to the formed at least one magnetic resonance image using a three-dimensional diffeomorphic transformation, wherein and the segmenting is performed using the transferred segmentation data, and
wherein said at least one magnetic resonance image provides at least one integrating feature to facilitate automatic segmentation.

9. The workstation according to claim 8, wherein said at least one integrating feature provided by said at least one magnetic resonance image facilitates automatic segmentation of said soft tissue region by at least one of: a correction of intensity homogeneity; a plurality of contrasts; a suppression of at least one tissue component; a quantification of at least one magnetic resonance (MR) parameter, or variations thereof.

10. The workstation according to claim 8, wherein said at least one template and the at least one magnetic resonance image being normalized are based on at least one common magnetic resonance (MR) contrast.

11. The workstation according to claim 8, wherein said normalizing engine is constructed to implement at least one transformation using an algorithm of Large Deformation Diffeomorphic Metric Mapping (LDDMM).

12. The workstation according to claim 8, further comprising:
an analyzing engine to perform quantitative analysis associated with the segmented soft tissue region.

13. The workstation according to claim 12, wherein said analysis is related to at least one transformation matrix used by said normalizing engine.

14. The workstation according to claim 8, further comprising:
a diagnosing engine constructed to compare the results from said quantitative analysis with a knowledge database.

15. The workstation according to claim 14, wherein said diagnosing engine is constructed to compare by correlating statistics of said quantitative analysis and said knowledge database.

16. The workstation according to claim 14, wherein said knowledge database comprises data from a normal population and a clinical population.

17. A method of automatic segmentation, comprising:
receiving magnetic resonance signals for forming at least one magnetic resonance image showing a soft tissue region from a subject, wherein said at least one magnetic resonance image provides at least one integrating feature to facilitate automatic segmentation;
preprocessing said magnetic resonance signals to generate at least one magnetic resonance image by utilizing said at least one integrating feature;
receiving at least one template corresponding to said soft tissue region;
normalizing the generated at least one magnetic resonance image based on said at least one template to generate a segmented view of said soft tissue region,
wherein said normalizing further comprises: transferring segmentation data from the at least one template to the generated at least one magnetic resonance image using a three-dimensional diffeomorphic transformation; and generating the segmented view using the transferred segmentation data.

18. The method according to claim 17, wherein said at least one integrating feature provided by said at least one magnetic resonance image facilitates automatic segmentation by at least one of: a correction of intensity homogeneity; a plurality of contrasts; a suppression of at least one tissue component; a quantification of at least one magnetic resonance (MR) parameter, and variations thereof.

19. The method according to claim 18, wherein said plurality of contrasts relates to at least one of a relaxation time, a diffusion property, a perfusion property, a blood oxygenation level dependent property, a proton-density property, and variations thereof.

20. The method according to claim 17, wherein said at least one template and the at least one magnetic resonance image are based on at least one common magnetic resonance (MR) contrast.

21. The method according to claim 17, wherein said template contains information identifying said soft tissue region.

22. The method according to claim 21, wherein said information comprises at least one probabilistic map of said soft tissue region.

23. The method according to claim 17, wherein said normalizing comprises at least one transformation using an algorithm of Large Deformation Diffeomorphic Metric Mapping (LDDMM).

24. The method according to claim 17, further comprising: using at least one existing transformation matrix to normalize a new magnetic resonance image.

25. The method according to claim 17, further comprising: analyzing data associated with the segmented soft tissue region.

26. The method according to claim 25, wherein said data comprises at least one transformation matrix used during said normalizing.

27. The method according to claim 25, further comprising: diagnosing by comparing the results from said analyzing with a knowledge database.

28. The method according to claim 27, wherein said comparing comprises correlating based on statistics associated with said analyzing and said knowledge database.

29. The method according to claim 27, wherein said knowledge database comprises data from a normal population and a clinical population.

30. The method according to claim 29, further comprising: adding the results from said analyzing to said knowledge database if said diagnosing is positive.

31. A computer-readable medium comprising software, which when executed by a computer system, causes the computer system to:
receive magnetic resonance signals for forming at least one magnetic resonance image showing a soft tissue region from a subject, wherein said at least one magnetic resonance image provides at least one integrating feature to facilitate automatic segmentation;
preprocess said magnetic resonance signals to generate at least one magnetic resonance image by utilizing said at least one integrating feature;
receive at least one template corresponding to said soft tissue region; and
normalize the generated at least one magnetic resonance image based on said at least one template to generate a segmented view of said soft tissue region,
wherein said normalizing further comprises: transferring segmentation data from the at least one template to the generated at least one magnetic resonance image using a three-dimensional diffeomorphic transformation; and generating the segmented view using the transferred segmentation data.

* * * * *